US011021795B2

(12) United States Patent
Lau et al.

(10) Patent No.: US 11,021,795 B2
(45) Date of Patent: *Jun. 1, 2021

(54) MULTI ZONE SPOT HEATING IN EPI

(71) Applicant: Applied Materials, Inc., Santa Clara, CA (US)

(72) Inventors: Shu-Kwan Lau, Sunnyvale, CA (US); Koji Nakanishi, Taito-Ku (JP); Toshiyuki Nakagawa, Narita (JP); Zuoming Zhu, Sunnyvale, CA (US); Zhiyuan Ye, San Jose, CA (US); Joseph M. Ranish, San Jose, CA (US); Nyi O. Myo, San Jose, CA (US); Errol Antonio C. Sanchez, Tracy, CA (US); Schubert S. Chu, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 127 days.

This patent is subject to a terminal disclaimer.

(21) Appl. No.: 16/170,255

(22) Filed: Oct. 25, 2018

(65) Prior Publication Data

US 2019/0127851 A1    May 2, 2019

Related U.S. Application Data

(60) Provisional application No. 62/578,850, filed on Oct. 30, 2017.

(51) Int. Cl.
*C23C 16/46* (2006.01)
*H01L 21/67* (2006.01)
(Continued)

(52) U.S. Cl.
CPC .......... *C23C 16/46* (2013.01); *B23K 26/0006* (2013.01); *B23K 26/032* (2013.01);
(Continued)

(58) Field of Classification Search
None
See application file for complete search history.

(56) References Cited

U.S. PATENT DOCUMENTS

| 2,910,554 A | * | 10/1959 | Lessler | ............. | G03B 15/0442 |
| | | | | | 200/51.08 |
| 4,217,039 A | * | 8/1980 | Zellner | ............... | G03B 21/115 |
| | | | | | 353/119 |

(Continued)

FOREIGN PATENT DOCUMENTS

| TW | 201642349 A | 12/2016 |
| TW | 201724320 A | 7/2017 |
| TW | 201735171 A | 10/2017 |

OTHER PUBLICATIONS

PCT Notification of Transmittal of the International Search Report and the Written Opinion of the International Searching Authority for International Application No. PCT/US2018/054408; dated Feb. 1, 2019; 12 total pages.

(Continued)

*Primary Examiner* — Charles Capozzi
(74) *Attorney, Agent, or Firm* — Patterson + Sheridan, LLP

(57) ABSTRACT

Embodiments of the present disclosure generally relate to apparatus and methods for semiconductor processing, more particularly, to a thermal process chamber. The thermal process chamber includes a substrate support, a first plurality of heating elements disposed over or below the substrate support, and a spot heating module disposed over the substrate support. The spot heating module is utilized to provide local heating of cold regions on a substrate disposed on the substrate support during processing. Localized heating of the substrate improves temperature profile, which in turn improves deposition uniformity.

19 Claims, 11 Drawing Sheets

(51) Int. Cl.
*H01L 21/687* (2006.01)
*B23K 26/00* (2014.01)
*B23K 26/12* (2014.01)
*B23K 26/06* (2014.01)
*B23K 26/03* (2006.01)
*B23K 26/08* (2014.01)
*C23C 16/52* (2006.01)
*B23K 26/352* (2014.01)

(52) U.S. Cl.
CPC ........ *B23K 26/034* (2013.01); *B23K 26/0604* (2013.01); *B23K 26/08* (2013.01); *B23K 26/123* (2013.01); *B23K 26/126* (2013.01); *B23K 26/127* (2013.01); *B23K 26/128* (2013.01); *B23K 26/352* (2015.10); *C23C 16/52* (2013.01); *H01L 21/6719* (2013.01); *H01L 21/67115* (2013.01); *H01L 21/67248* (2013.01); *H01L 21/68742* (2013.01); *H01L 21/68764* (2013.01); *H01L 21/68785* (2013.01); *H01L 21/68757* (2013.01)

(56) References Cited

U.S. PATENT DOCUMENTS

| | | | |
|---|---|---|---|
| 4,836,138 A * | 6/1989 | Robinson | C23C 16/481 118/666 |
| 2010/0065759 A1 | 3/2010 | Liu et al. | |
| 2011/0036293 A1 | 2/2011 | Pei | |
| 2011/0253910 A1* | 10/2011 | Beck Keissary | F41H 13/0043 250/492.1 |
| 2013/0323936 A1* | 12/2013 | Ranish | H01L 21/67248 438/795 |
| 2014/0246422 A1 | 9/2014 | Koren et al. | |
| 2016/0071745 A1 | 3/2016 | Kim et al. | |
| 2017/0103907 A1 | 4/2017 | Chu et al. | |

OTHER PUBLICATIONS

Taiwan Office Action dated Oct. 18, 2019 for Application No. 107137338.

* cited by examiner

MULTI ZONE SPOT HEATING IN EPI

CROSS-REFERENCE TO RELATED APPLICATIONS

This application claims priority to U.S. Provisional Patent Application Ser. No. 62/578,850, filed on Oct. 30, 2017, which herein is incorporated by reference.

BACKGROUND

Field

Embodiments of the present disclosure generally relate to apparatus and methods for semiconductor substrate processing, more particularly, to a thermal process chamber useful for semiconductor substrate processing.

Description of the Related Art

Semiconductor substrates are processed for a wide variety of applications, including the fabrication of integrated circuit devices and microdevices such as MEMS. In one known process apparatus for depositing a layer of material on the substrate, during processing of the substrate, the substrate is positioned on a susceptor within a process chamber. The susceptor is supported by a support shaft, which is rotatable about a central axis to rotate the susceptor attached to one end thereof. Precise control of a heating source, such as a plurality of heating lamps disposed below and above the substrate, allows the substrate to be heated during processing thereof to within a very strict tolerance range. The temperature of the substrate can affect the uniformity of the material deposited on the substrate.

Despite the precise control of the heat source used to heat the substrate, it has been observed that valleys (lower deposition layer thickness regions) are formed at certain locations on the substrate. Therefore, a need exists for a thermal process chamber for semiconductor processing capable of improved control of the uniformity of the substrate temperature.

SUMMARY

Embodiments of the present disclosure generally relate to apparatus and methods for semiconductor substrate processing, more particularly, to a thermal process chamber useful for semiconductor substrate processing. In one embodiment, a process chamber includes a chamber body, a substrate support disposed in the chamber body, a radiant module disposed outside the chamber body facing the substrate support, a support disposed outside the chamber body, a mounting bracket disposed on the support, and a spot heating module coupled to the mounting bracket.

In another embodiment, a process chamber includes a chamber body, a substrate support disposed in the chamber body, a support disposed outside the chamber body, a mounting bracket disposed on the support, and a spot heating module coupled to the mounting bracket. The spot heating module includes a movable stage coupled to the mounting bracket.

In another embodiment, a process chamber includes a chamber body, a substrate support disposed in the chamber body, a support disposed outside the chamber body, a mounting bracket disposed on the support, and a spot heating module coupled to the mounting bracket. The spot heating module includes at least one adjustable wedge.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
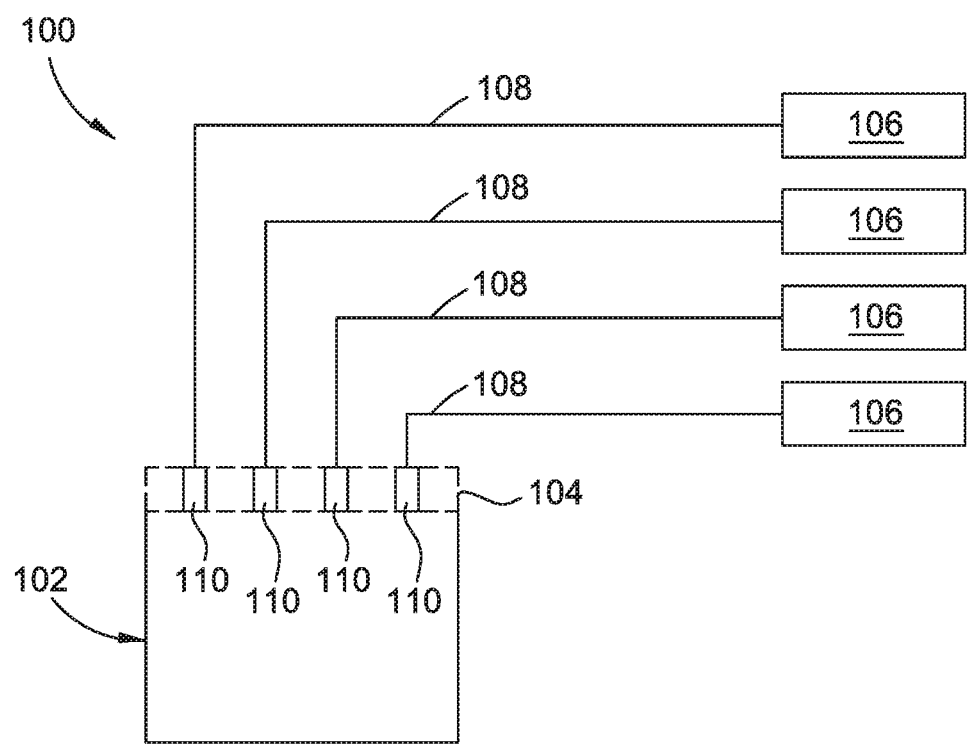
FIG. 1 is a schematic side view of an apparatus according to one embodiment.

To facilitate understanding, identical reference numerals have been used, where possible, to designate identical elements that are common to the figures. It is contemplated that elements disclosed in one embodiment may be beneficially utilized in other embodiments without specific recitation thereof with respect thereto.

DETAILED DESCRIPTION

Embodiments of the present disclosure generally relate to apparatus and methods for semiconductor processing, more particularly, to a thermal process chamber. The thermal process chamber includes a substrate support, a first plurality of heating elements disposed over or below the substrate support, and a spot heating module disposed over the substrate support. The spot heating module is utilized to provide localized heating of a substrate disposed on the substrate support during processing. The localized heating described herein improves thermal uniformity across a substrate disposed on the substrate support during processing, which in turn improves deposition uniformity.

A "substrate" or "substrate surface," as described herein, generally refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon dopes silicon oxide or nitride materials. The substrate itself is not limited to any particular size or shape. Although the embodiments herein are generally related to round 200 mm or 300 mm substrates, other shapes, such as polygonal, square, rectangular, curved, or otherwise non-circular workpieces may be utilized.

FIG. 1 is a schematic side view of an apparatus 100 according to one embodiment. The apparatus 100 includes a process chamber 102 and one or more high-energy radiant sources 106. The process chamber 102 may be a deposition or a thermal treatment chamber, such as a vapor phase epitaxy chamber, a rapid thermal process chamber, or a thermal treatment chamber. The process chamber 102 includes a spot heating module 104, and the spot heating module 104 is optically connected to the one or more high-energy radiant sources by one or more optical fibers 108.

The spot heating module 104 includes one or more spot heaters 110, and each spot heater 110 is connected to a high-energy radiant source 106 via a corresponding optical fiber 108. In one embodiment, a single radiant source 106 is optically coupled to more than one spot heater by a plurality of optical fibers 108, so that one laser source is providing energy for multiple spot heaters 110. In another embodiment, each spot heater 110 is coupled to a corresponding radiant source 106 by an optical fiber 108.

The one or more high-energy radiant sources 106 are part of the spot heating module 104. For example each spot heater 110 may include a high-energy radiant source 106. The one or more high-energy radiant sources 106 may be focused high-energy radiant source, such as lasers. Examples of laser sources that may be used include crystal lasers, laser diodes and arrays, and VCSEL's. High intensity LED sources may also be used. Wavelength of the emitted radiation may generally be in the ultraviolet, visible, and/or infrared spectrum, from about 200 nm to about 900 nm, for example, 810 nm, and the emitted radiation may be monochromatic, narrow band, broadband, or ultra-broadband such as a white laser. The one or more high-energy radiant sources 106 produce one or more high-energy radiant beams, such as focused high energy radiant beams, for example, laser beams, in order to perform localized, or spot, heating of the substrate disposed in the process chamber 102 during the thermal processing thereof.

Figure 2:
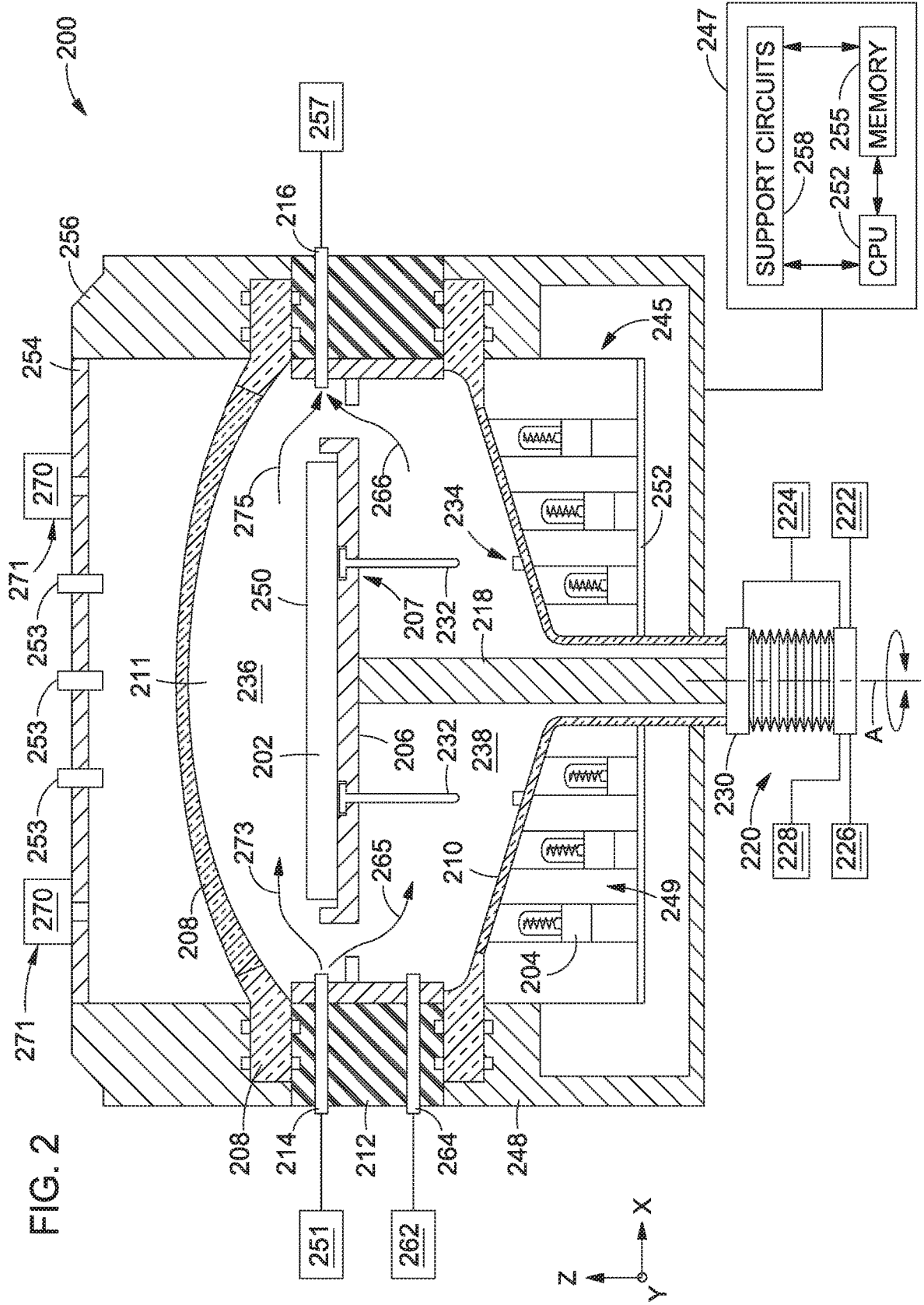
FIG. 2 is a schematic cross sectional side view of a process chamber according to one embodiment.
Figure 3:
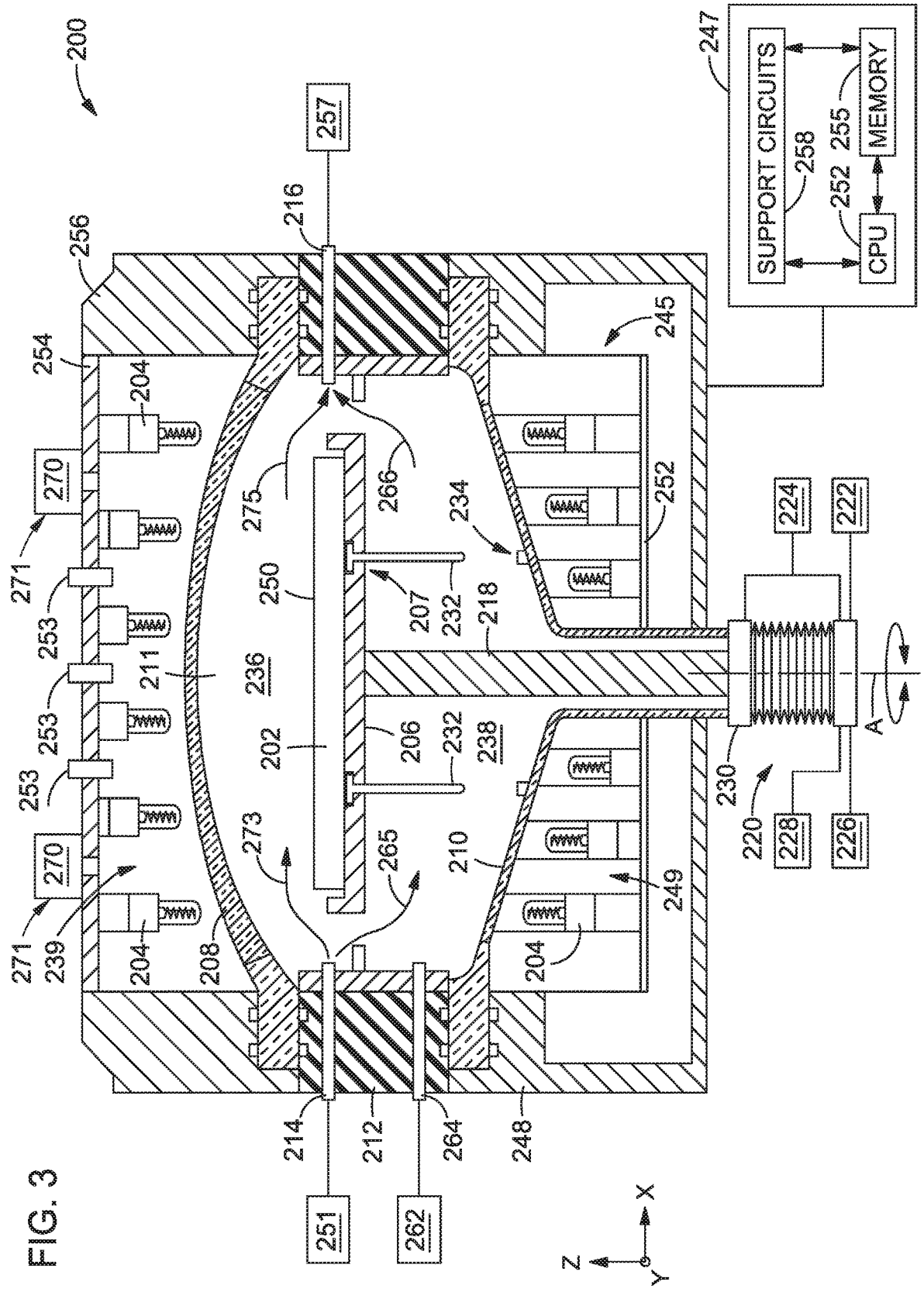
FIG. 3 is a schematic cross sectional side view of a process chamber according to another embodiment.

FIGS. 2 and 3 illustrate a schematic sectional view of a process chamber 200 according to one embodiment. The process chamber 200 may be the process chamber 102 shown in FIG. 1. The process chamber 200 may be used to process one or more substrates therein, including the processes of depositing a material on a device side 250 of a substrate 202, heating of the substrate 202, etching of the substrate 202, or combinations thereof. The process chamber 200 generally includes a chamber wall 248, and an array of radiant heating lamps 204 for heating, among other components, a susceptor 206 disposed within the process chamber 200. As shown in FIG. 2 and FIG. 3, an array of radiant heating lamps 204 may be disposed below (i.e. facing the non-device side of) the susceptor 206. As shown in FIG. 3, an array of radiant heating lamps 204 may be disposed below and/or above the susceptor 206. The susceptor 206 may be a disk-like substrate support as shown, or may include a ring-like substrate support (not shown), which supports the substrate 202 from the edge of the substrate to expose a backside of the substrate 202 directly to heat from the radiant heating lamps 204. The susceptor 206 may be fabricated from silicon carbide or graphite coated with silicon carbide to absorb radiant energy from the lamps 204 and conduct the radiant energy to the substrate 202, thus heating the substrate 202.

The susceptor 206 is located within the process chamber 200 between a first energy transmissive member 208, which may be a dome, and a second energy transmissive member 210, which may also be a dome. The first energy transmissive member 208 and the second energy transmissive member 210, along with a body 212 that is disposed between the first energy transmissive member 208 and second energy transmissive member 210, generally define an internal region 211 of the process chamber 200. Each of the first energy transmissive member 208 and/or the second energy transmissive member 210 may be convex and/or concave. In some embodiments, each of the first energy transmissive member 208 and/or the second energy transmissive member 210 may be optically transparent to the high-energy radiant radiation (transmitting at least 95% of the radiation of the high-energy radiant radiation). In one embodiment, the first energy transmissive member 208 and the second energy transmissive member 210 are fabricated from quartz. In some embodiments, the array of radiant heating lamps 204 may be disposed above the first energy transmissive member 208, for example, a region 239 defined between the first energy transmissive member 208 and a reflector 254 (discussed infra), as shown in FIG. 3. In some embodiments, the array of the radiant heating lamps 204 may be disposed adjacent to and beneath the second energy transmissive member 210. The radiant heating lamps 204 may be independently controlled in zones in order to control the temperature of various regions of the substrate 202 as a process gas or vapor passes over the surface of the substrate 202, thus facilitating the deposition of a material onto the device side 250 of the substrate 202. While not discussed here in detail, the deposited material may include elemental semiconductor materials such as silicon, doped silicon, germanium, and doped germanium; semiconductor alloys such as silicon germanium and doped silicon germanium; and compound semiconductor materials, including III-V materials, examples of which include nitrides, phosphides, and arsenides of aluminum, gallium, indium, and thallium, and mixtures thereof, and II-VI materials, examples of which include sulfides, selenides and tellurides of zinc, cadmium, and mixtures thereof.

The radiant heating lamps 204 may provide a total lamp power of between about 10 KW and about 60 KW, and are configured to heat the substrate 202, for example to a temperature within a range of about 200 degrees Celsius to about 1,600 degrees Celsius. Each lamp 204 can be coupled to a power distribution board, such as printed circuit board (PCB) 252, through which power is supplied to each lamp 204. In one embodiment, the radiant heating lamps 204 are positioned within a housing 245 which is configured to be cooled during or after processing by, for example, using a cooling fluid introduced into channels 249 located between the radiant heating lamps 204.

The substrate 202 is transferred into the process chamber 200 and positioned onto the susceptor 206 through a loading port (not shown) formed in the body 212. A process gas inlet 214 and a gas outlet 216 are provided in the body 212.

The susceptor 206 includes a shaft or stem 218 that is coupled to a motion assembly 220. The motion assembly 220 includes one or more actuators and/or adjustment devices that provide movement and/or adjustment of the position of the stem 218 and/or the susceptor 206 within the internal region 211. For example, the motion assembly 220 here includes a rotary actuator 222 that rotates stem 218, and thus the susceptor 206, about the longitudinal axis A of the process chamber 200 perpendicular to an X-Y plane of the process chamber 200. The motion assembly 220 also includes a vertical actuator 224 to move the stem 218, and thus susceptor 206, in the Z direction (e.g. vertically) within the process chamber 200. The motion assembly 220 optionally includes a tilt adjustment device 226 that is used to adjust the planar orientation of the susceptor 206 in the internal region 211. The motion assembly 220 optionally also includes a lateral adjustment device 228 that is utilized to adjust the positioning of the stem 218 and/or the susceptor 206 in the x-y plane of the process chamber 200 within the internal region 211. In one embodiment, the motion assembly 220 includes a pivot mechanism 230.

The susceptor 206 is shown in an elevated processing position but is lifted or lowered vertically by the motion assembly 220 as described above. The susceptor 206 is lowered to a transfer position (below the processing position) to allow lift pins 232 to contact standoffs 234 on or above the second energy transmissive member 210. The stand-offs provide one or more surfaces parallel to the X-Y plane of the process chamber 200 and help to prevent binding of the lift pins 232 that may occur if the end thereof is allowed to contact the curved surface of the second energy transmissive member 210. The stand-offs 234 are made of an optically transparent material, such as quartz, to allow energy from the lamps 204 to pass therethrough. The lift pins 232 are suspended in holes 207 in the susceptor 206, and as the susceptor 206 is lowered and the bottom of the lift pins 232 engage the standoffs 234, further downward movement of the susceptor 206 causes the lift pins 232 to engage the substrate 202 and hold it stationary as the susceptor 206 is further lowered, and thus support the substrate off of the susceptor 206 for transfer thereof from the process chamber 200. A robot (not shown) then enters the process chamber 200 to engage at least the underside of the substrate 202 and remove the substrate 202 therefrom though the loading port. A new substrate 202 may then be loaded onto the lift pins 232 by the robot, and the susceptor 206 may then be actuated up to the processing position to place the substrate 202 thereon, with its device side 250 facing up. The lift pins 232 include an enlarged head allowing the lift pins 232 to be suspended in openings in the susceptor 206 when in the processing position. The susceptor 206, while located in the processing position, divides the internal volume of the process chamber 200 into a process gas region 236 above the susceptor 206, and a purge gas region 238 below the susceptor 206. The susceptor 206 is rotated during processing using the rotary actuator 222 to minimize the effect of thermal and process gas flow spatial anomalies within the process chamber 200 and thus facilitates uniform processing of the substrate 202. The susceptor 206 here rotates at between about 5 RPM and about 100 RPM, such as between about 10 RPM and about 50 RPM, for example about 30 RPM.

Substrate temperature is measured by sensors configured to measure temperatures at the bottom of the susceptor 206. The sensors may be pyrometers (not shown) disposed in ports formed in the housing 245. Additionally or alternatively, one or more sensors 253, such as a pyrometer, are used to measure the temperature of the device side 250 of the substrate 202. A reflector 254 may be optionally placed outside the first energy transmissive member 208 to reflect infrared light that is radiating off the substrate 202 and redirect the energy back onto the substrate 202. The reflector 254 here is secured to the first energy transmissive member 208 using a clamp ring 256. The reflector 254 can be made of a metal such as aluminum or stainless steel. The sensors 253 can be disposed through the reflector 254 to receive radiation from the device side 250 of the substrate 202.

Process gas supplied from a process gas supply source 251 is introduced into the process gas region 236 through the process gas inlet 214 formed in the sidewall of the body 212. The process gas inlet 214 is configured to direct the process gas in a generally radially inward direction. As such, in some embodiments, the process gas inlet 214 is a side gas injector. The side gas injector is positioned to direct the process gas across a surface of the susceptor 206 and/or the substrate 202. During a film formation process for forming a film layer of the substrate 202, the susceptor 206 is located in the processing position, which is adjacent to and at about the same elevation as the process gas inlet 214, thus allowing the process gas to flow generally along flow path 273 across the upper surface of the susceptor 206 and/or substrate 202. The process gas exits the process gas region 236 (along flow path 275) through the gas outlet 216 located on the opposite side of the process chamber 200 from the process gas inlet 214. Removal of the process gas through the gas outlet 216 here is facilitated by a vacuum pump 257 coupled thereto.

Purge gas supplied from a purge gas source 262 is introduced to the purge gas region 238 through a purge gas inlet 264 formed in the sidewall of the body 212. The purge gas inlet 264 is disposed at an elevation below the process gas inlet 214. The purge gas inlet 264 is configured to direct the purge gas in a generally radially inward direction. The purge gas inlet 264 may be configured to direct the purge gas in an upward direction. During a film formation process, the susceptor 206 is located at a position such that the purge gas flows generally along flow path 265 across a back side of the susceptor 206. The purge gas exits the purge gas region 238 (along flow path 266) and is exhausted out of the process chamber through the gas outlet 216 located on the opposite side of the process chamber 200 as the purge gas inlet 264.

The process chamber 200 further includes a spot heating module 271. The spot heating module 271 may be the spot heating module 104 shown in FIG. 1. The spot heating module 271 includes one or more spot heaters 270. The spot heater 270 may be the spot heater 110 shown in FIG. 1. The spot heating module 271 is utilized to spot heating cold spots on the substrate 202 during processing. Cold spots may be formed on the substrate 202 at locations that the substrate 202 is in contact with the lift pins 232.

The above-described process chamber 200 can be controlled by a processor based system controller, such as controller 247, shown in FIGS. 2 and 3. For example, the controller 247 is configured to control flow of various precursor and process gases and purge gases from gas sources, during different operations of a substrate processing sequence. By way of further example, the controller 250 is configured to control a firing of the spot heating module 271, predict an algorithm for firing the spot heating module 271, and/or encode or synchronize the operation of the spot heating module 271 with substrate rotation, feeding of gases, lamp operation, or other process parameters, among other controller operations. The controller 247 includes a programmable central processing unit (CPU) 252 that is operable with a memory 255 and a mass storage device, an input control unit, and a display unit (not shown), such as clocks, cache, input/output (I/O) circuits, and the like, coupled to the various components of the process chamber 200 to facilitate control of substrate processing in the process chamber 200. The controller 247 further includes support circuits 258. To facilitate control of the process chamber 200 described above, the CPU 252 may be one of any form of general purpose computer processor that can be used in an industrial setting, such as a programmable logic controller (PLC), for controlling various chambers and sub-processors. The memory 255 is in the form of computer-readable storage media that contains instructions, that when executed by the CPU 252, facilitates the operation of the process chamber 200. The instructions in the memory 255 are in the form of a program product such as a program that implements the method of the present disclosure.

Figure 4:
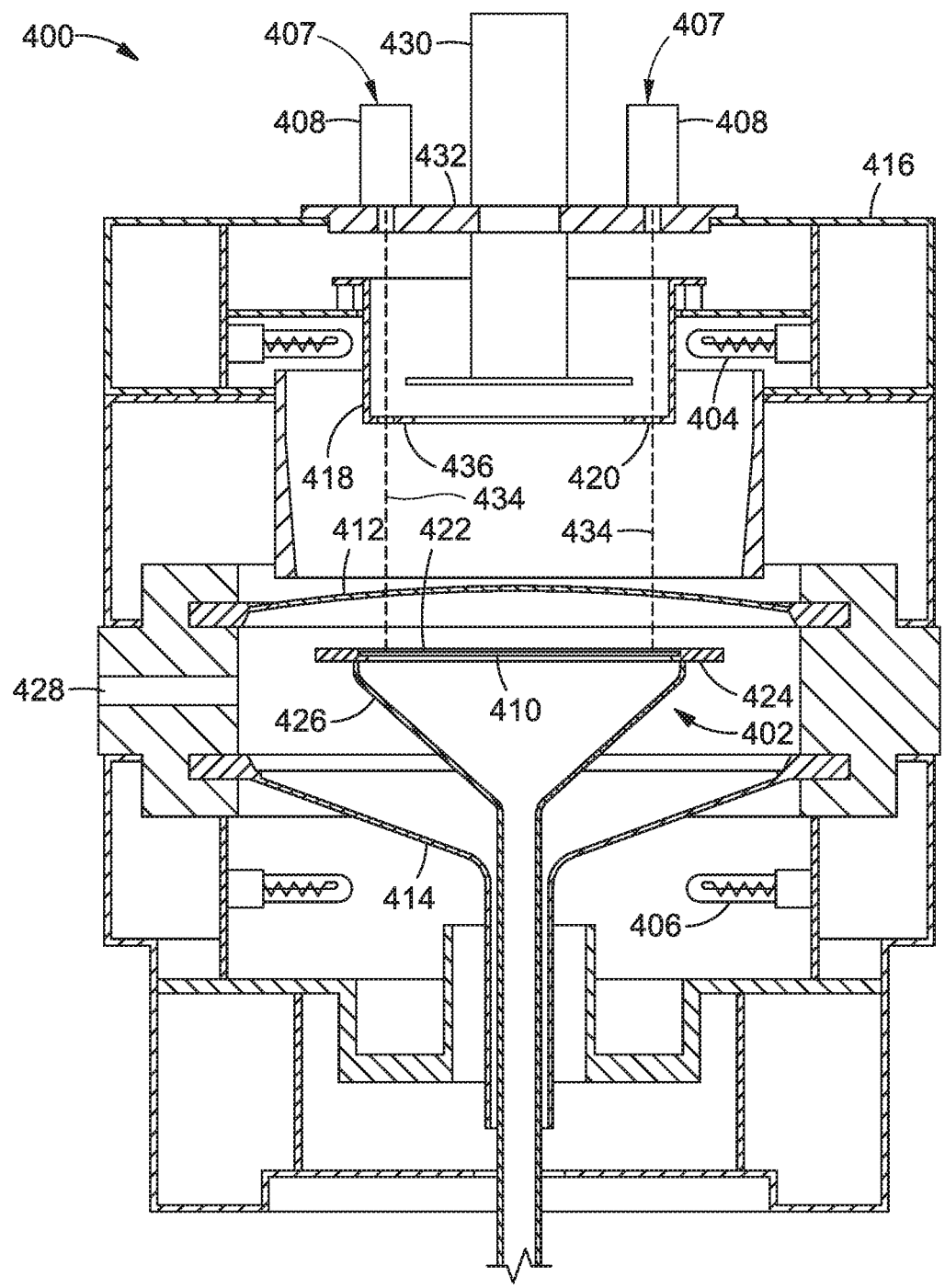
FIG. 4 is a schematic cross sectional side view of a process chamber according to a yet another embodiment.

FIG. 4 is a schematic cross sectional side view of a process chamber 400 according to one embodiment. The process chamber 400 may be the process chamber 102 shown in FIG. 1. The process chamber 400 is configured to process one or more substrates, including the deposition of a material on a deposition surface 422 of a substrate 410. The process chamber 400 includes a first energy transmissive member 412, a second energy transmissive member 414, and a substrate support 402 disposed between the first energy transmissive member 412 and the second energy transmissive member 414. The first energy transmissive member 412 and the second energy transmissive member 414 may be fabricated from the same material as the first energy transmissive member 208 and the second energy transmissive member 210 shown in FIG. 2.

The substrate support 402 here includes a susceptor 424 for supporting the substrate 410 and a susceptor support 426 for supporting the susceptor 424. The substrate 410 is brought into the process chamber 400 through a loading port 428 and positioned on the susceptor 424. The susceptor 424 may be made of SiC coated graphite. The susceptor support 426 is here rotated by a motor (not shown), which in turn rotates the susceptor 424 and the substrate 410.

The process chamber 400 includes a first plurality of heating elements 406, such as radiant heating lamps, disposed below the second energy transmissive member 414 for heating the substrate 410 from below the substrate 410. The process chamber 400 also includes a second plurality of heating elements 404, such as radiant heating lamps, disposed over the first energy transmissive member 412 for heating the substrate 410 from above the substrate 410. In one embodiment, the first and second plurality of heating elements 404, 406 provide infrared radiant heat to the substrate though the first energy transmissive member 412 and the second energy transmissive member 414, respectively. The first and second energy transmissive members 412, 414 are optically transparent to the wavelength of the energy from the heating elements 404, 406, for example infrared radiation emitted by lamps, transparent defined herein as transmitting at least 95% of the received infrared radiation.

In one embodiment, the process chamber 400 also includes one or more temperature sensors 430, such as optical pyrometers, which are used to measure temperatures within the process chamber 400 and on the surface 422 of the substrate 410. The one or more temperature sensors 430 are disposed on a support member 432 that is disposed on a cover 416. A reflector 418 is placed outside the first energy transmissive member 412 to reflect infrared light radiating from the substrate 410 and the first energy transmissive member 412 back towards the substrate 410. A spot heating module 407 is disposed on the support member 432. The spot heating module 407 may be the spot heating module 104 shown in FIG. 1. The spot heating module 407 includes one or more spot heater 408. The spot heater 408 may be the spot heater 110 shown in FIG. 1. The spot heating module 407 produces one or more high-energy radiant beams 434, such as focused high-energy radiant beams, for example laser beams, which form one or more beam spots on the surface 422 of the substrate 410 in order to perform localized heating of the substrate 410. Where the spot heating module 407 is located above the reflector 418, the one or more high-energy radiant beams 434 pass through an opening 420 formed in an annular portion 436 of the reflector 418, and the first energy transmissive member 412 is optically transparent to the wavelength of the high-energy radiant beams (transmitting at least 95% of the received radiation of the high-energy radiant beam 434).

During operation, such as an epitaxial deposition process, the substrate 410 is heated to a predetermined temperature, such as less than about 750 degrees Celsius. Despite the precise control of heating the substrate 410, one or more regions on the substrate 410 may experience temperature non-uniformity, such as being about 2-5 degrees Celsius lower than rest of the substrate 410. This temperature non-uniformity leads to non-uniformity in the deposited film thickness, such as a thickness non-uniformity of one percent or more in a film deposited on the substrate. In order to improve the temperature uniformity of the substrate, which in turn reduces the film thickness non-uniformity, the spot heating module 407 is used to locally heat one or more regions on the substrate 410. Since the substrate 410 is rotating during operation, the localized heating by the spot heating module 407 may occur be over an annular region at a certain radius of the substrate 410.

The temperature sensor 430 may be used to modulate power to the spot heating module 407. For example, a controller (not shown) may receive temperature data from the temperature sensor 430, and may increase or reduce power to the spot heating module 407 based on the temperature data. In such a system, the combination of temperature sensor 430 and spot heating module 407 can be used in closed-loop or open-loop control to adjust the spot heating module 407 based on a reading from the temperature sensor 430.

Figure 5:
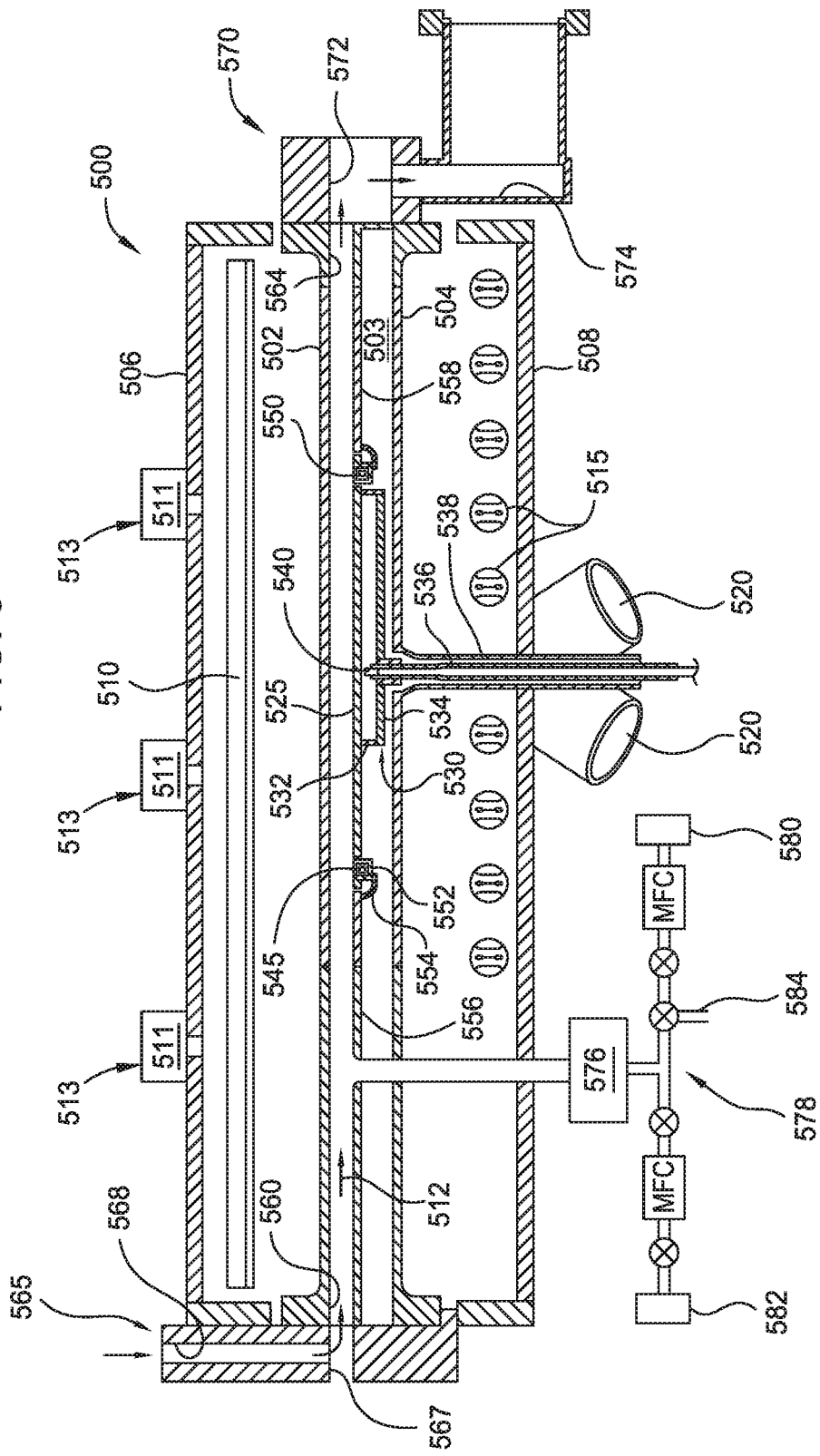
FIG. 5 is a schematic cross sectional side view of a process chamber according to a yet another embodiment.

FIG. 5 is a schematic cross sectional side view of a process chamber 500 according to another embodiment. The process chamber 500 may be the process chamber 102 shown in FIG. 1. The process chamber 500 may generally have the shape of a rectangular box. The process chamber 500 includes a first energy transmissive member 502, a second energy transmissive member 504, and a region 503 defined by the first and second energy transmissive members 502, 504 and therebetween. The first energy transmissive member 502 and the second energy transmissive member 504 may be fabricated from the same material as the first energy transmissive member 208 and the second energy transmissive member 210 shown in FIG. 2. In the embodiment of FIG. 5, the first and second energy transmissive members 502 and 504 are flat, and made of quartz transparent to the wavelength of energy to be passed therethrough to heat a substrate.

A first plurality of radiant heat sources 510 is disposed over the first energy transmissive member 502. The first plurality of radiant heat sources 510 here are be elongated tube-type radiant heating elements. The radiant heat sources 510 are disposed in spaced-apart parallel relationship and also extend substantially parallel to a reactant gas flow path (shown by arrow 512) through the process chamber 500. A second plurality of radiant heat sources 515 is positioned below the second energy transmissive member 504, and oriented transverse to the first plurality of radiant heat sources 510. A plurality of spot heat sources 520 supply concentrated heat to the underside of the substrate support structure (described below), to counteract a heat sink effect created by cold support structures extending through the bottom of the process chamber 500. A spot heating module 513 is disposed on a cover 506 located over the first plurality of radiant heat sources 510. The spot heating module 513 may be the spot heating module 104 shown in FIG. 1. The spot heating module 513 includes one or more spot heaters 511. The spot heater 511 may be the spot heater 110 shown in FIG. 1. The spot heating module 513 produces one or more high-energy radiant beams to perform localized heating of a substrate disposed in the process chamber 500. As is known in the art of semiconductor processing equipment, the power of the various heat sources 510, 511, 515, 520 can be controlled independently or in grouped zones in response to the substrate temperature measured through temperature sensors.

A substrate 525 is shown supported by a substrate support 530 disposed in the region 503. The substrate support 530 includes a substrate holder 532, upon which the substrate 525 rests, and a support spider 534. The spider 534 is mounted to a shaft 536, which extends downwardly through a tube 538 extending through a chamber bottom 508. The tube 538 communicates with a source of purge gas which can flow therethrough during processing of the substrate 525. A plurality of temperature sensors is positioned in proximity to the substrate 525. The temperature sensors may take a variety of forms, such as optical pyrometers or thermocouples. In the illustrated embodiment, the temperature sensors comprise thermocouples, including a first or central thermocouple 540, suspended below the substrate holder 532 in any suitable fashion. The central thermocouple 540 passes through the spider 534 in proximity to the substrate holder 532. The process chamber 500 further includes a plurality of secondary or peripheral thermocouples, also in proximity to the substrate 525, including a leading edge or front thermocouple 545, a trailing edge or rear thermocouple 550, and a side thermocouple (not shown). Each of the peripheral thermocouples is housed within a slip ring 552, which surrounds the substrate holder 532 and the substrate 525. The slip ring 552 rests upon support members 554, which extend from a front chamber divider 556 and a rear chamber divider 558. The dividers 556, 558 are fabricated from quartz. Each of the central and peripheral thermocouples are connected to a temperature controller, which sets the power of the various heat sources 510, 515, 520 in response to the temperature readings from the thermocouples.

The process chamber 500 further includes an inlet port 560 for the injection of reactant and carrier gases, and the substrate 525 can also be received therethrough. An outlet port 564 is on the opposite side of the process chamber 500, with the substrate support 530 positioned between the inlet port 560 and outlet port 564. An inlet component 565 is fitted to the process chamber 500, adapted to surround the inlet port 560, and includes a horizontally elongated slot 567 through which the substrate 525 can be inserted. A generally vertical inlet 568 receives gases from gas sources and communicates such gases with the slot 567 and the inlet port 560. An outlet component 570 similarly mounts to the process chamber 500 such that an exhaust opening 572 aligns with the outlet port 564 and leads to exhaust conduits 574. The conduits 574, in turn, can communicate with suitable vacuum means (not shown) for exhausting process gases from the process chamber 500. The process chamber 500 also includes a source 576 of excited species, positioned below the chamber bottom 508. The excited species source 576 may be a remote plasma generator disposed along a gas line 578. A source of precursor gases 580 is coupled to the gas line 578 for introduction into the excited species source 576. A source of carrier gas 582 is also coupled to the gas line 578. One or more branch lines 584 can also be provided for additional reactants. The excited species source 576 can be employed for plasma enhanced deposition, but also may be utilized for exciting etchant gas species for cleaning the process chamber 500 of excess deposition material when no substrate is in the process chamber 500.

Figure 6A:
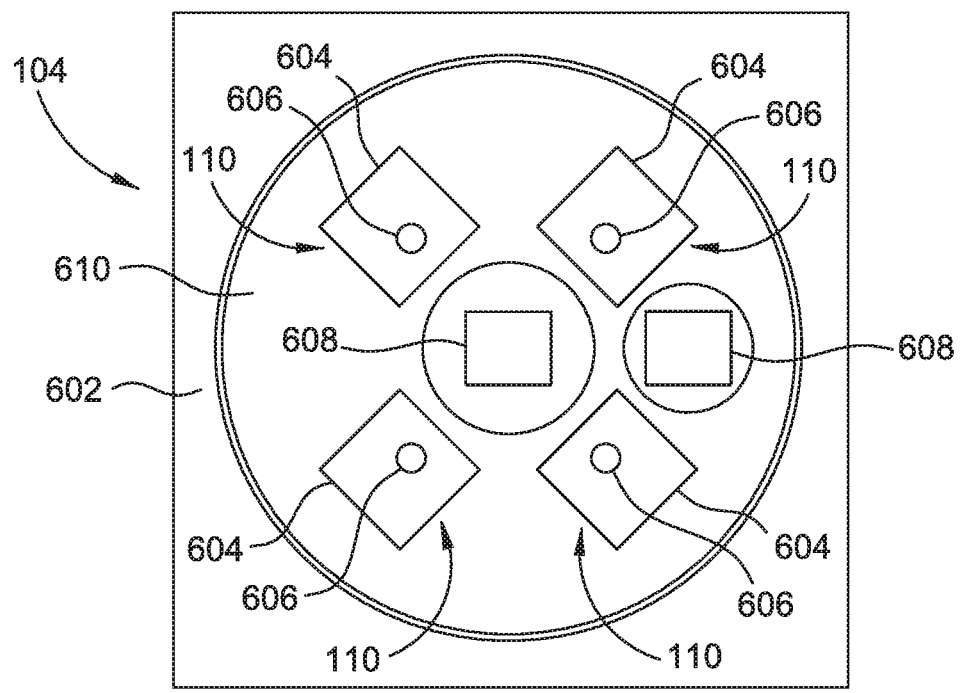
FIGS. 6A-6B are schematic top views of a spot heating module according to the embodiments.
Figure 6B:
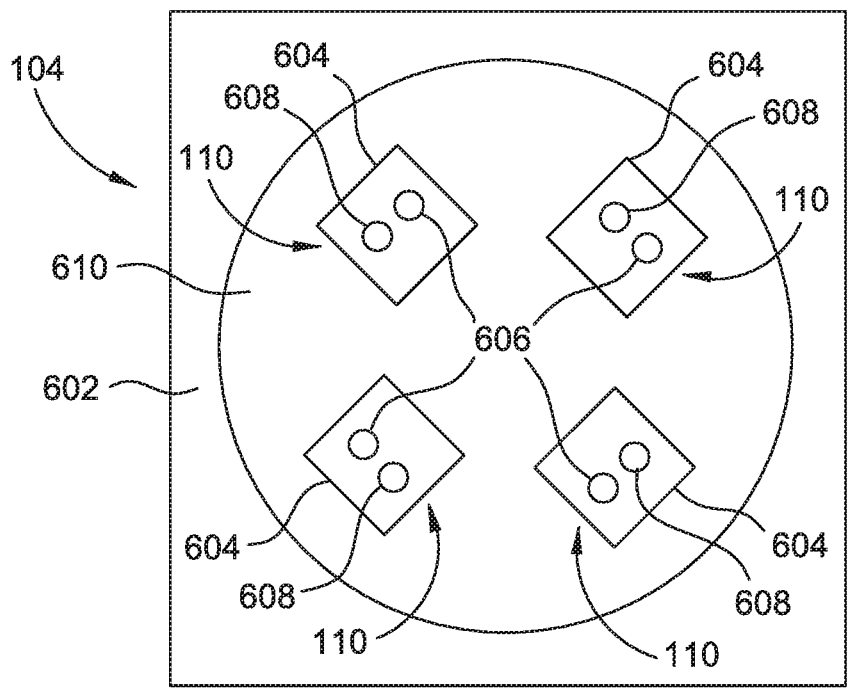

FIGS. 6A-6B are schematic top views of the spot heating module 104 according to embodiments of the present disclosure. As shown in FIG. 6A, the spot heating module 104 includes one or more spot heaters 110. The one or more spot heaters 110 are disposed on a support 610 that is integrated into or on a chamber cover 602. The chamber cover 602 may be the reflector 254 of the process chamber 200 shown in FIGS. 2 and 3, the cover 416 of the process chamber 400 shown in FIG. 4, or the cover 506 of the process chamber 500 shown in FIG. 5. Each spot heater 110 includes a stage 604 disposed on the support 610 and a collimator 606 disposed on the stage 604. The one or more collimators 606 are connected to the one or more high-energy radiant sources 106 via one or more fibers 108 shown in FIG. 1. One or more sensors 608, such as pyrometers, are disposed on the support 610. In some embodiments, each spot heater 110 includes the collimator 606 and the sensor 608, and both the collimator 606 and the sensor 608 are disposed on a single stage 604, as shown in FIG. 6B. In some embodiments, the collimator 606 is replaced with a high-energy radiant source, such as a laser or laser diode, and each spot heater 110 includes a high-energy radiant source disposed on the stage 604.

The collimator is an optical element that collimates radiation from one of the high-energy radiant sources, for example by use of appropriately designed lenses. The collimator has a first end, into which radiation from a radiant source is input, for example by directing the output of a laser source into an opening in the first end. The collimator may have a second end with an opening where a collimating lens is housed. Different size collimators may be used to form different sized beams of radiation, if desired. The stage 604 may have a mounting feature, such as a bracket, that is adjustable in size to accommodate collimators of different sizes that can be swapped out to give heating spots that are different sizes.

In other embodiments, a laser may be directly mounted to the collimator by inserting a beam exit portion of the laser into the first end of the collimator such that the radiation emitted by the laser passes through the collimator and exits through the second end with the collimating lens.

Figure 7A:
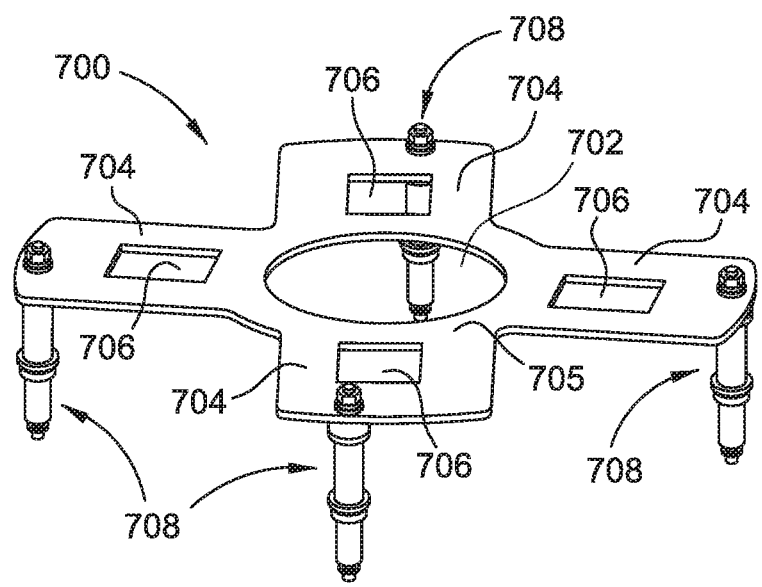
FIGS. 7A-7B are perspective views of a mounting bracket for mounting the spot heating module of FIGS. 6A-6B according to embodiments.
Figure 7B:
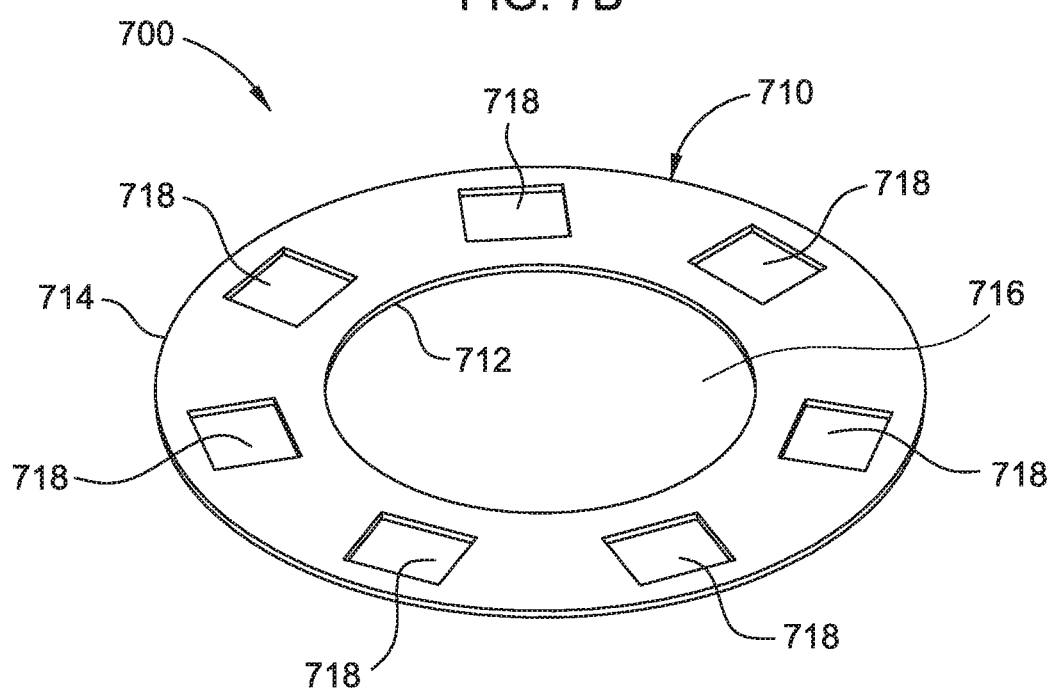

FIGS. 7A-7B are perspective views of a mounting bracket 700 for mounting the spot heating module 104 according to embodiments hereof. In some embodiments, the spot heaters 110 of the spot heating module 104 are coupled to the mounting bracket 700 instead of the support 610, so the spot heaters 110 can be conveniently added to or removed from a process chamber. Because the spot heaters 110 and the sensors 608 are coupled to different components, the addition or removal of the spot heaters 110 will not affect the sensors 608. In one embodiment, as shown in FIG. 7A, the mounting bracket 700 includes an annular portion 705 surrounding a central opening 702 and one or more plates 704 extending from the annular portion 705. Each plate 704 has an opening 706 formed therein allowing the high-energy radiation produced by the spot heater 110 to pass through. The number of plates 704 extending from the annular portion here correspond to the number of spot heaters 110. In one embodiment, there are four spot heaters 110, and each spot heater 110 is coupled to a corresponding plate 704. The central opening 702 and/or the space between adjacent plates 704 may be utilized to accommodate one or more sensors 608 between adjacent plates 704. The mounting bracket 700 is secured to the one or more components of the process chamber 102 by a plurality of securing devices 708.

FIG. 7B is a perspective view of a mounting bracket according to another embodiment. In some embodiments, the mounting bracket of FIG. 7B includes a body 710 having an inner edge 712 and an outer edge 714. In one embodiment, the body 710 is annular. In another embodiment, the body 710 is rectangular. The inner edge 712 defines an opening 716. One or more openings 718 are formed through the body 710 between the inner edge 712 and the outer edge 714 thereof. Each spot heater 110 is coupled to the mounting bracket 700 at a location surrounding an opening 718, so the high-energy radiant beam produced by the spot heater 110 can pass through the opening. In some embodiments, there are more openings 718 than the spot heaters 110, and the extra openings 718 and/or the opening 716 may be utilized to accommodate one or more sensors 608 in the openings 716 and 718.

Figure 8:
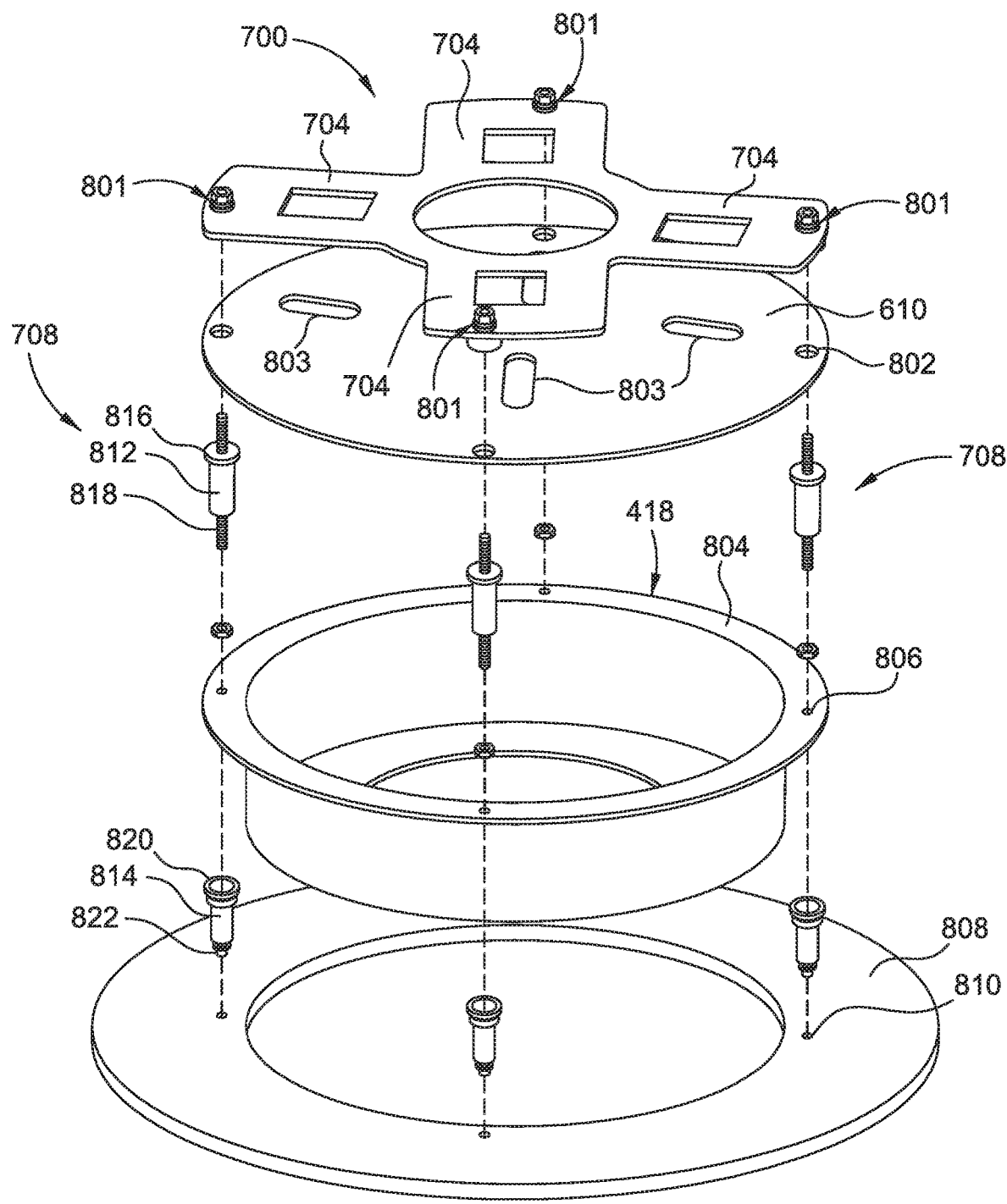
FIG. 8 is an exploded view of the mounting bracket of FIGS. 7A-7B secured to components of a process chamber according to one embodiment.

FIG. 8 is an exploded view of the mounting bracket 700 secured to components of a process chamber according to one embodiment. In one embodiment, the process chamber is the process chamber 400. As shown in FIG. 8, the mounting bracket 700 is disposed on the support 610, the support 610 is disposed on the reflector 418, and the reflector 418 is surrounded by another support 808. The support 808 may be secured to the process chamber 400. Each plate 704 includes an opening 801 that is aligned with a corresponding opening 802 formed in the support 610, a corresponding opening 806 formed in a flange portion 804 of the reflector 418, and a corresponding opening 810 formed in the support 808. The aligned openings 801, 802, 806, 810 are utilized to secure the mounting bracket 700 with the securing devices 708. The support 610 includes a plurality of openings 803 that are aligned with the openings 706 (FIG. 7A) to allow the high-energy radiation produced by the spot heater 110 to pass through.

In one embodiment, the securing device 708 is a single screw extending through the openings 801, 802, 806, 810, and the single threaded fastener is secured to the mounting bracket 700 and the support 808 by a securing mechanism, such as a nut. In another embodiment, as shown in FIG. 8, the securing device 708 includes a first piece 812 disposed between the support 610 and the reflector 418 and a second piece 814 disposed between the flange portion 804 of the reflector 418 and the support 808. The first piece 812 includes a first threaded rod 816 and a second threaded rod 818 opposite the first threaded rod 816, and the second piece 814 includes a first end 820 and a second end 822 opposite the first end 820. The first threaded rod 816 extends through the opening 802 of the support 610 and the opening 801 of the mounting bracket 700, and the first threaded rod 816 is secured to the mounting bracket 700 by a securing mechanism, such as a nut. The second threaded rod 818 of the first piece 812 extends through the opening 806 formed in the flange portion 804 of the reflector 418. The second threaded rod 818 of the first piece 812 is configured to be inserted into, and secured by, the first end 820 of the second piece 814. The second end 822 of the second piece 814 extends through the opening 810 formed in the support 808 and is secured to the support 808. By securing the mounting bracket 700 to the support 808, physical stability of the mounting bracket 700 and the spot heaters 110 is improved.

Figure 9:
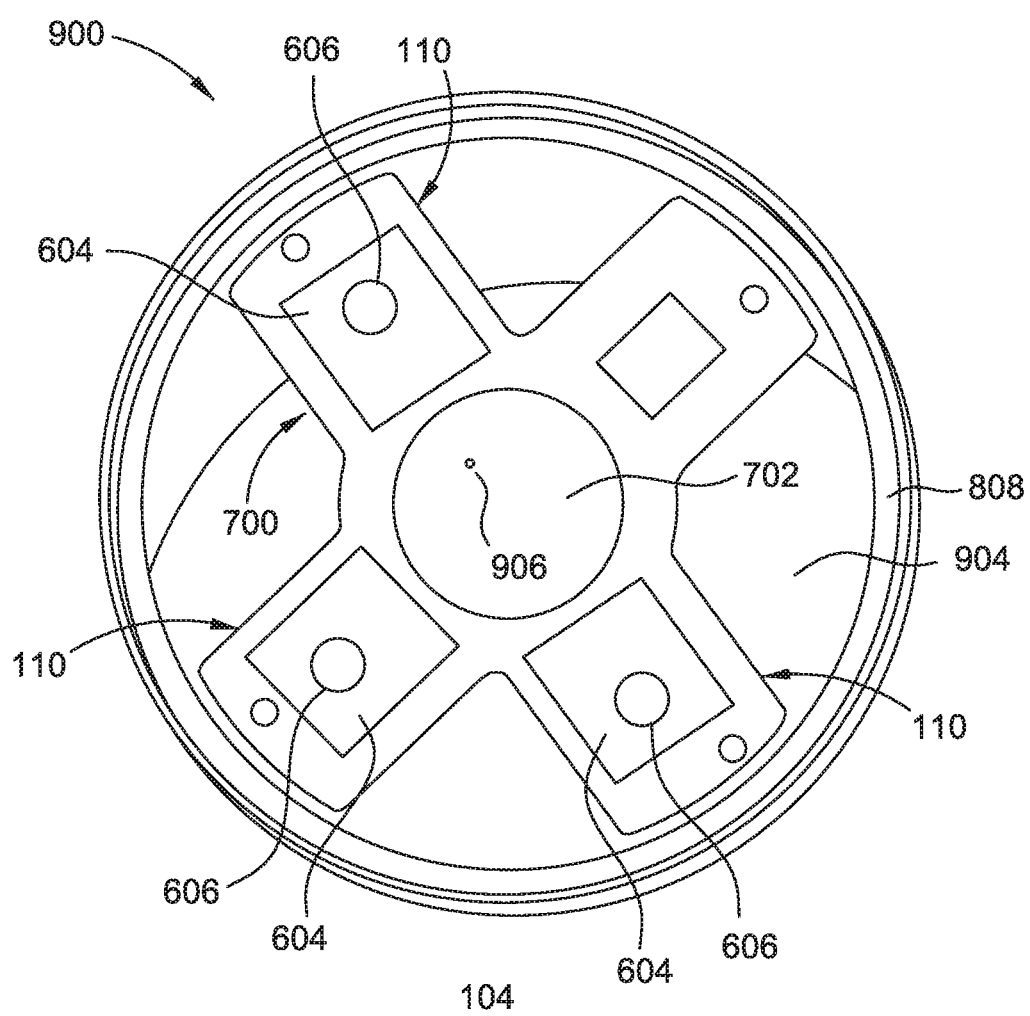
FIG. 9 is a schematic top view of the spot heating module of FIGS. 6A-6B mounted to a process chamber according to one embodiment.

FIG. 9 is a schematic top view of the spot heating module 104 mounted to a process chamber 900 according to one embodiment. The process chamber 900 may be the process chamber 200 shown in FIG. 2. The process chamber 900 includes a susceptor 904 having a plurality of through holes 906 for a plurality of lift pins (not shown) to extend therethrough. The susceptor 904 may be the susceptor 206 of the process chamber 200 shown in FIG. 2, and the through holes 906 may be the through holes 207 of the process chamber 200 shown in FIG. 2. As shown in FIG. 9, the one or more spot heaters 110 of the spot heating module 104 are coupled to the mounting bracket 700, and the mounting bracket 700 is secured to the support 808. During an alignment process, any components between the mounting bracket 700 and the susceptor 904 may be removed, so an operator can view a guide beam produced by the spot heater 110 landing on the susceptor 904. The susceptor 904 may be rotated so the region to be heated by the spot heater is pointed to by the guide beam. The guide beam may be produced by a lower intensity laser directly coupled, or fiber-coupled, to the spot heater 110.

Figure 10:
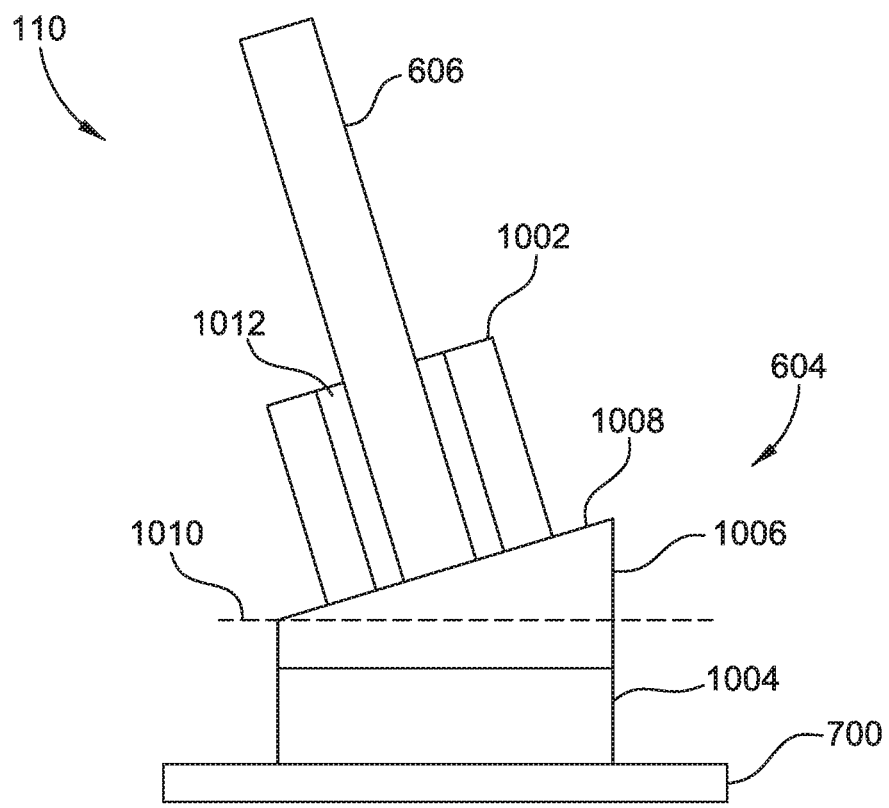
FIG. 10 is a schematic side view of a spot heater according to one embodiment.

FIG. 10 is a schematic side view of the spot heater 110 according to one embodiment. As shown in FIG. 10, the spot heater 110 includes the collimator 606 held by a collimator holder 1002. The collimator holder 1002 is disposed on the stage 604, and the stage 604 is disposed on the mounting bracket 700. The stage 604 includes a slider 1004 and a wedge 1006. The slider 1004 is movable linearly on the mounting bracket 700 using set screws or an actuator. The wedge 1006 includes a surface 1008 that is in contact with the collimator holder 1002, and the surface 1008 forms an angle A with respect to a plane 1010 that is substantially parallel to a major surface of the susceptor, such as the susceptor 206 of the process chamber 200 shown in FIG. 2. In one embodiment, the angle A of the wedge 1006 is set, and a plurality of wedges having different angles A are utilized to adjust the guide beam. The angle A may range from about one degree to about 30 degrees. In another embodiment, the angle A of the wedge 1006 is adjustable by an actuator located in the wedge 1006. Targeting of the spot heater 110 can be accomplished by selecting the angle A of the wedge 1006 and by adjusting the location of the slider 1004. The guide beam described above can be activated, and the slider 1004 adjusted, to bring the radiation of the spot heater 110 to a selected location for processing.

As noted above, collimators of different sizes may be used with the spot heater of FIG. 10. An optional adapter 1012 may be used in the collimator holder 1002 to effectively reduce the size of the opening within the collimator holder 1002 to fit a smaller collimator 606. In this way, collimators of different sizes can be swapped into the spot heater 110 of FIG. 6 to allow beam spots of different sizes to be used. The adapter 1012 is shown in FIG. 10 as a cylinder, but the adapter 1012 could be a generally cylindrical or ring-like member that is inserted into the collimator holder 1002, thus reducing the diameter of the collimator holder 1002. A ring-link adapter 1012 could fit into the collimator holder 1002 at the upper end, where the opening accommodates insertion of the collimator 606, in a middle region, or at the lower end where the collimator holder 1002 contacts the wedge 1006. Using an adapter such as the adapter 1012 enables use of a smaller collimator that fits the inner diameter of the adapter 1012 in the collimator holder 1002.

Benefits of the present disclosure include a reduction in the number of cold spots associated with a substrate. Reducing the temperature non-uniformities within a substrate further creates a substrate with a more uniform surface. A cost reduction is also realized in that there is an increase in substrate quality. Additional benefits include precise local heating of the substrate for ultra-fine tuning of temperature uniformity.

Figure 11A:
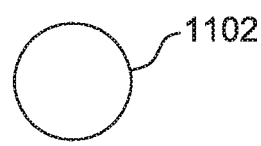
FIGS. 11A-11B are schematic views of a beam spot formed by one or more spot heaters of FIG. 10 according to one embodiment.
Figure 11B:
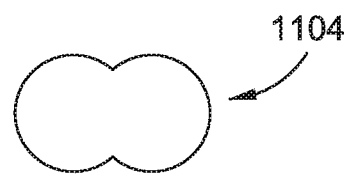

FIGS. 11A-11B are schematic views of a beam spot formed by one or more spot heaters 110 according to one embodiment. As shown in FIG. 11A, a beam spot 1102 is formed by one spot heater 110 (FIG. 10). The beam spot 1102 may be too small to achieve the localized heating of a substrate. The beam spot 1102 can be modified without making changes to the optics of the spot heater 110. For example, as shown in FIG. 11B, a beam spot 1104 is formed by two spot heaters 110 (FIG. 10). The two spot heaters 110 are positioned so the beam spots produced by the spot heaters 110 overlap.

Figure 12A:
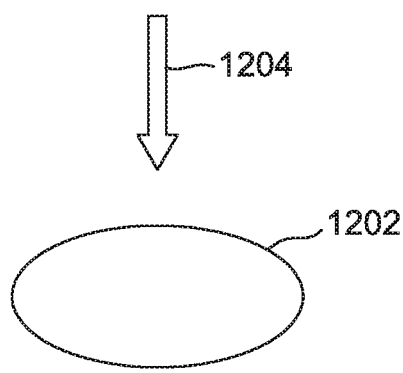
FIGS. 12A-12B are schematic views of a beam spot having different orientations with respect to the movement of a substrate according to one embodiment.
Figure 12B:
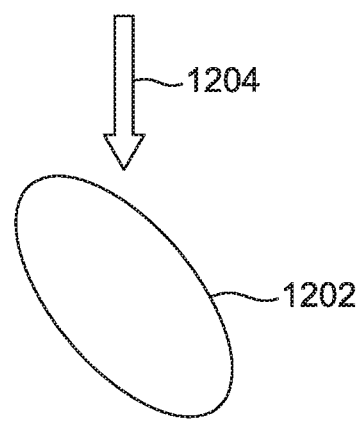

FIGS. 12A-12B are schematic views of a beam spot having different orientations with respect to the movement of a substrate according to one embodiment. As shown in FIG. 12A, a beam spot 1202 has a shape of an ellipse. In one embodiment, the major axis of the ellipse shaped beam spot 1202 is substantially perpendicular to the direction of the substrate movement, as indicated by arrow 1204. When the major axis of the beam spot 1202 is substantially perpendicular to the direction of the movement of the substrate, the beam spot 1202 has a wide width. The width of the beam spot 1202 can be adjusted without making changes to the optics of the spot heater 110. In one embodiment, the width of the beam spot 1202 can be changed by rotating the collimator 606 (FIG. 10). As shown in FIG. 12B, the rotation of the collimator 606 causes the beam spot 1202 to rotate. Thus, the major axis of the ellipse shaped beam spot 1202 is not substantially perpendicular to the direction of the movement of the substrate, leading to a narrower width of the beam spot 1202.

In summation, embodiments described herein provide an epitaxial deposition chamber which includes a spot heating module for providing localized heating of a substrate during processing. Energy may be focused to about a 10 mm area during substrate rotation within the chamber in order to locally heat and tune specific locations of the substrate, such as locations adjacent a lift pin, at specifically timed intervals. In some cases, the spot heating elements can be targeted to specific locations by measuring deposition thickness profile of a test substrate, finding locations of the test substrate that would have benefitted from spot heating, marking those locations on the test substrate, re-inserting the test substrate into the chamber, and using the targeting functionality (guide beam and positioning adjustments) described herein to direct the spot heating to the marked locations. Subsequent substrates can then be spot heated by the targeted spot heating elements to address systematic processing non-uniformities.

While the foregoing is directed to embodiments of the present disclosure, other and further embodiments of the disclosure may be devised without departing from the basic scope thereof, and the scope thereof is determined by the claims that follow.

The invention claimed is:

1. A process chamber, comprising:
   a chamber body;
   a substrate support disposed in the chamber body;
   a radiant module disposed outside the chamber body facing the substrate support;
   a support disposed outside the chamber body;
   a mounting bracket disposed on the support outside the chamber body; and
   a plurality of spot heating modules coupled to the mounting bracket, the mounting bracket including a plurality of openings formed therein at different angular positions with respect to a center of the mounting bracket, wherein each opening of the plurality of openings is positioned between a respective spot heating module of the plurality of spot heating modules and the substrate support.

2. The process chamber of claim 1, wherein each spot heating module comprises a laser source and a plurality of collimators, each collimator optically coupled to a respective laser source by an optical fiber.

3. The process chamber of claim 2, wherein each laser source is a laser diode array.

4. The process chamber of claim 1, further comprising at least one thermal sensor positioned on the support disposed outside the chamber body.

5. The process chamber of claim 4, wherein each spot heating module is a laser source and each thermal sensor is a pyrometer.

6. A process chamber, comprising:
   a chamber body;
   a substrate support disposed in the chamber body;
   a support disposed outside the chamber body;
   a mounting bracket disposed on the support outside the chamber body; and
   a plurality of spot heating modules coupled to the mounting bracket, each spot heating module comprising a movable stage coupled to the mounting bracket, the movable stage including a slider and a wedge, the mounting bracket including a plurality of openings formed therein at different angular positions with respect to a center of the mounting bracket, wherein each opening of the plurality of openings is positioned between a respective spot heating module of the plurality of spot heating modules and the substrate support.

7. The process chamber of claim 6, wherein each spot heating module comprises a radiant a fiber-coupled laser source.

8. The process chamber of claim 7, wherein the mounting bracket includes an annular portion surrounding a central opening, and one or more plates extending from the annular portion.

9. A process chamber, comprising:
   a chamber body;
   a substrate support disposed in the chamber body;
   a support disposed outside the chamber body;
   a mounting bracket disposed on the support disposed outside the chamber body; and
   a plurality of spot heating modules coupled to the mounting bracket, each spot heating module comprising at least one adjustable wedge, the mounting bracket including an annular portion surrounding a central opening, a plurality of plates extending from the annular portion, and a plurality of openings formed in the plurality of plates, wherein each opening of the plurality of openings is positioned between a respective spot heating module of the plurality of spot heating modules and the substrate support.

10. The process chamber of claim 9, wherein each spot heating module is coupled to one of the plurality of plates by a movable stage.

11. The process chamber of claim 10, further comprising at least one thermal sensor coupled to the mounting bracket.

12. The process chamber of claim 9, further comprising a guide beam generator coupled to each spot heating module.

13. The process chamber of claim 1, further comprising a reflector located between the radiant module and the mounting bracket.

14. The process chamber of claim 13, wherein the reflector includes a plurality of openings formed therein, the plurality of openings each positioned between a respective spot heating module of the plurality of spot heating modules and the substrate support.

15. The process chamber of claim 14, wherein the reflector, the support disposed outside the chamber body, and the mounting bracket are secured by a plurality of securing devices, each securing device of the plurality of securing devices comprising a first threaded rod connected to the mounting bracket and the support disposed outside the chamber body, and a second threaded rod connected to the support disposed outside the chamber body and the reflector, wherein the plurality of securing devices space the reflector, the support disposed outside the chamber body, and the mounting bracket from each other in a fixed position.

16. The process chamber of claim 1, wherein the mounting bracket is planar.

17. The process chamber of claim 6, wherein each opening of the openings in the mounting bracket is aligned with a corresponding opening formed in the support disposed outside the chamber body.

18. The process chamber of claim 9, further comprising a slider that is linearly movable on the mounting bracket.

19. The process chamber of claim 9, wherein each opening of the openings in the mounting bracket is aligned with a corresponding opening formed in the support disposed outside the chamber body.

\* \* \* \* \*

UNITED STATES PATENT AND TRADEMARK OFFICE
CERTIFICATE OF CORRECTION

PATENT NO. : 11,021,795 B2
APPLICATION NO. : 16/170255
DATED : June 1, 2021
INVENTOR(S) : Shu-Kwan Lau et al.

Page 1 of 1

It is certified that error appears in the above-identified patent and that said Letters Patent is hereby corrected as shown below:

In the Claims

In Column 14, Line 46, in Claim 7, after "comprises" delete "a radiant".

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*